United States Patent
Utomo et al.

(10) Patent No.: US 8,236,637 B2
(45) Date of Patent: Aug. 7, 2012

(54) PLANAR SILICIDE SEMICONDUCTOR STRUCTURE

(75) Inventors: Henry K. Utomo, Hopewell Junction, NY (US); Sameer Hemchand Jain, Hopewell Junction, NY (US); Ravikumar Ramachandran, Hopewell Junction, NY (US); Cung D. Tran, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 12/893,245

(22) Filed: Sep. 29, 2010

(65) Prior Publication Data

US 2012/0074503 A1    Mar. 29, 2012

(51) Int. Cl.
*H01L 21/8238* (2006.01)

(52) U.S. Cl. .. 438/199; 438/229; 438/300; 257/E21.634

(58) Field of Classification Search ............. 257/368, 257/369, E29.122, E21.634; 438/199, 229, 438/300
See application file for complete search history.

(56) References Cited

U.S. PATENT DOCUMENTS

| | | | |
|---|---|---|---|
| 5,310,692 A | 5/1994 | Chan et al. | |
| 5,536,684 A | 7/1996 | Dass et al. | |
| 5,874,769 A | 2/1999 | Chan et al. | |
| 5,958,505 A | 9/1999 | Mantl | |
| 6,034,410 A | 3/2000 | Chan et al. | |
| 6,090,691 A * | 7/2000 | Ang et al. | 438/564 |
| 6,096,613 A | 8/2000 | Wu | |
| 6,165,902 A | 12/2000 | Pramanick et al. | |
| 6,171,910 B1 * | 1/2001 | Hobbs et al. | 438/275 |
| 6,194,296 B1 | 2/2001 | Lien | |
| 6,369,429 B1 | 4/2002 | Pramanick et al. | |
| 6,579,765 B1 | 6/2003 | Ellis | |
| 2002/0008261 A1 * | 1/2002 | Nishiyama | 257/288 |
| 2004/0262683 A1 * | 12/2004 | Bohr et al. | 257/338 |
| 2005/0260801 A1 * | 11/2005 | Divakaruni et al. | 438/151 |

* cited by examiner

*Primary Examiner* — Matthew W Such
*Assistant Examiner* — Scott Stowe
(74) *Attorney, Agent, or Firm* — Howard M. Cohn; H. Daniel Schnurmann (57) ABSTRACT

A planar silicide structure and method of fabrication is disclosed. A FET having a silicided raised source-drain structure is formed where the height of the source-drain structures are the same as the height of the gates, simplifying the process of forming contacts on the FET. One embodiment utilizes a replacement metal gate FET and another embodiment utilizes a gate-first FET.

8 Claims, 8 Drawing Sheets

PLANAR SILICIDE SEMICONDUCTOR STRUCTURE

FIELD OF THE INVENTION

The present invention pertains to semiconductor fabrication. More specifically, the present invention pertains to fabrication of field effect transistors.

BACKGROUND OF THE INVENTION

There is an ever-present desire in the semiconductor fabrication industry to achieve individual devices with smaller physical dimensions. Reducing the dimensions of devices is referred to as scaling. Scaling is desirable in order to increase the number of individual devices that can be placed on a given area of semiconductor material and the process yield and to reduce the unit cost and the power consumption of individual devices.

However, scaling often creates some drawbacks. In particular, it can be difficult to form contacts on silicide regions of the transistors, as a very small "footprint" of area is available for placement of the contact. This often imposes a height requirement on the contacts, in order to achieve the appropriate contact dimensions at the base where it contacts the silicide regions. Therefore, it is desirable to have an improved structure and method for use in the fabrication of field effect transistors.

SUMMARY OF THE INVENTION

In one embodiment of the present invention, a method of fabricating a planar silicide semiconductor structure is provided. The method includes forming an NFET gate and a PFET gate on a surface of a substrate. The method also includes raising source regions and drain regions of epitaxial silicon adjacent to the NFET and PFET gates.

The method also includes planarizing the source and drain regions and the gates of the PFET and NFET to be of equal height above the surface of the substrate.

In another embodiment of the present invention, a method of fabricating a planar silicide semiconductor structure is provided. This method includes forming an NFET gate and a PFET gate on a surface of a substrate. The method also includes raising a source region and drain regions of epitaxial silicon adjacent to the NFET and the PFET gates. The method also comprises forming a source region and drain region of epitaxial silicon adjacent to the PFET gate, and planarizing the source and drain regions of the PFET and NFET, and the PFET and NFET gates to be of equal height. This method also includes implanting the source and drain regions of the PFET and NFET with a selection species.

In another embodiment of the present invention a planar silicide semiconductor structure is provided with a PFET and an NFET on a surface of a substrate. Each of the PFET and NFET comprises a gate, a source, and a drain. The source, drain and gate of each PFET and NFET is at the same height above the surface of the substrate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

DETAILED DESCRIPTION

Figure 1:
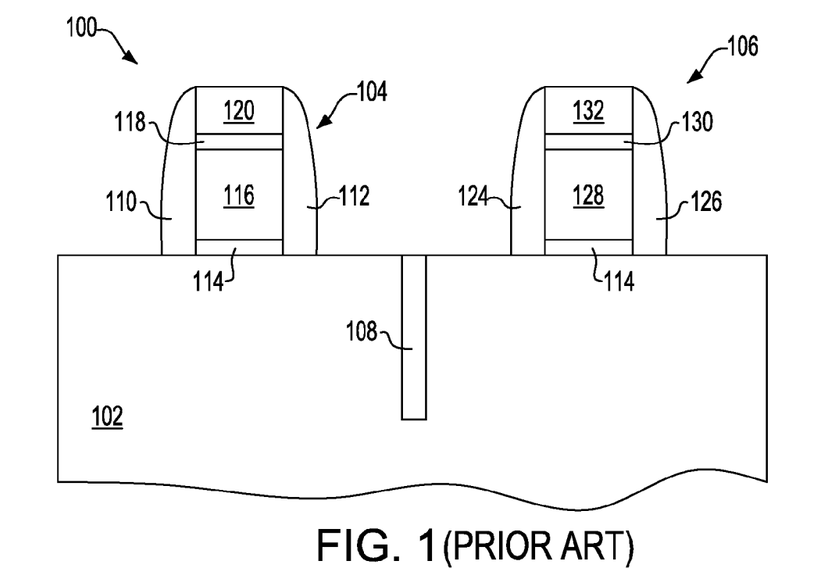
FIG. 1 is a prior art semiconductor structure which serves as a starting point for fabrication of a structure in accordance with an embodiment of the present invention.

FIG. 1 is a prior art semiconductor structure 100 which serves as a starting point for fabrication of a structure in accordance with an embodiment of the present invention. Semiconductor structure 100 comprises a silicon substrate 102. Two field effect transistors (FETs) are present on substrate 102, NFET 104 and PFET 106. NFET 104 and PFET 106 are separated by shallow trench isolation (STI) region 108. NFET 104 comprises gate oxide layer 114, gate 116, gate top oxide layer 118, and gate top nitride layer 120. Side spacers 110 and 112, comprised of nitride, are adjacent to the gate 116.

Similarly, PFET 106 comprises gate oxide layer 122, gate 128, gate top oxide layer 130, and gate top nitride layer 132. Side spacers 124 and 126, comprised of nitride, are adjacent to the gate 116.

Figure 2:
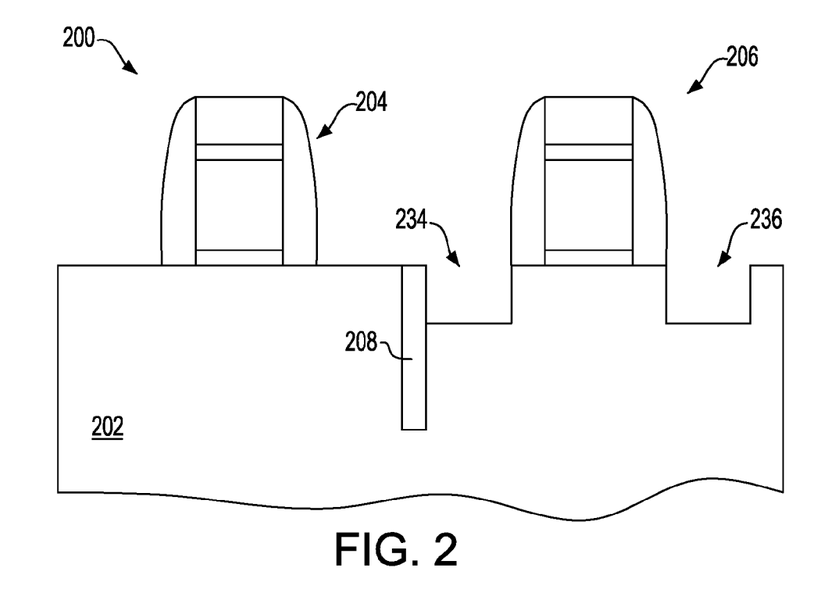
FIG. 2 shows a semiconductor structure after the intermediate processing step of forming recesses.

FIG. 2 shows a semiconductor structure 200 after an intermediate processing step. In this processing step, the substrate adjacent to PFET 206 is etched to form recesses 234 and 236. This etch may be performed using a RIE (reactive ion etch) process. In one embodiment, the recesses 234 and 236 are 15 to 65 nanometers deep. Well-known lithographic techniques may be used to form areas of resist (not shown) to protect various parts of structure 200 during the RIE process. This resist is then removed, resulting in semiconductor structure 200 as shown in FIG. 2. As stated previously, similar elements may be referred to by similar numbers in various figures (FIGs) of the drawing, in which case typically the last two significant digits may be the same. For example, STI region 208 is similar to STI region 108 of FIG. 1.

Figure 3:
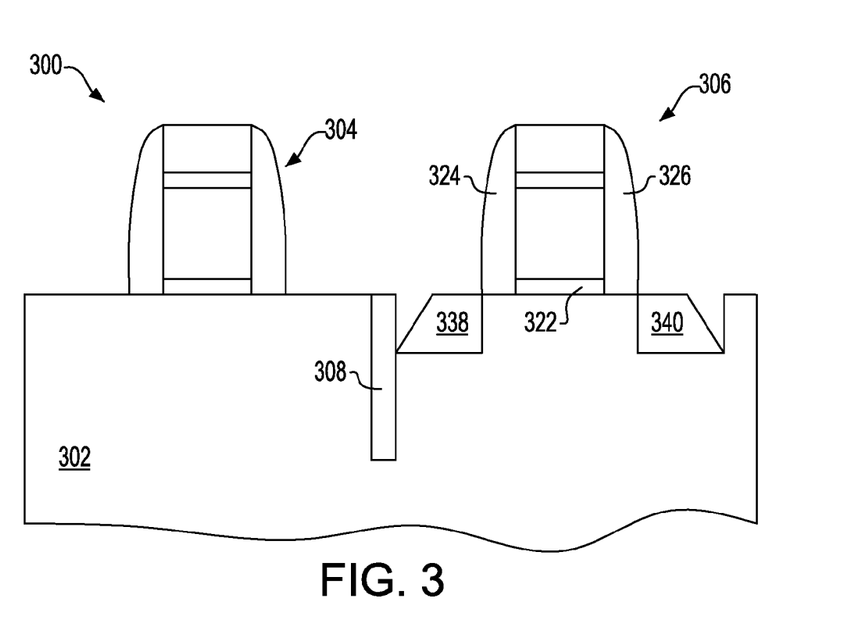
FIG. 3 shows a semiconductor structure after the intermediate processing step of forming SiGe regions.

FIG. 3 shows a semiconductor structure 300 after an intermediate processing step. In this processing step, SiGe (silicon-germanium) regions 338 and 340 are epitaxially grown (raised) in the recesses (234 and 236 of FIG. 2) adjacent to spacers 324 and 326 of PFET 306. The bottom surface of spacers 324 and 326 is preferably flush with the bottom surface of gate oxide 322. SiGe has a larger lattice constant than silicon, and so regions 338 and 340 serve to induce compressive channel strain. This strain enhances hole mobility, which is beneficial for PFET operation.

Figure 4:
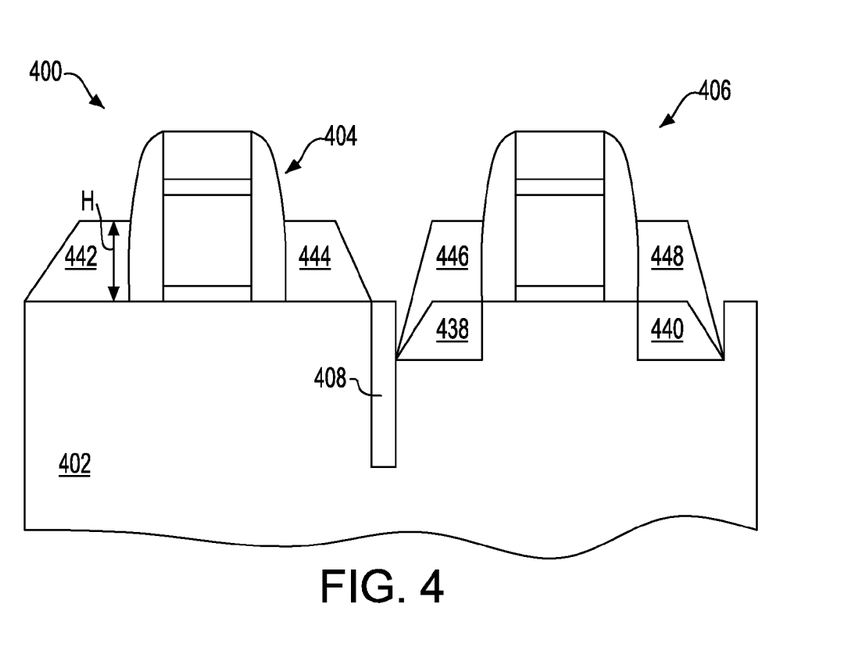
FIG. 4 shows a semiconductor structure after the intermediate processing step of raising source and drain regions.

FIG. 4 shows a semiconductor structure 400 after an intermediate processing step. In this processing step, epitaxial silicon regions 442 and 444 are grown on the NFET 404, and epitaxial silicon regions 446 and 448 are grown (raised) on the PFET 406. Regions 442, 444, 446 and 448 are not yet doped at this step in the fabrication process. Region 442 is the source region of the NFET 404, meaning that region 442 comprises the source of NFET 404, after appropriate fabrication steps, such as doping. Similarly, region 444 is the drain region of NFET 404. Region 446 is the source region of PFET 406 and region 448 is the drain region of PFET 406. Regions 442, 444, 446 and 448 become sources and drains once fabrication is complete. The height of the regions 442, 444, 446, and 448 are substantially the same, and are of the height H which represents the desired gate height of NFET 404 and PFET 406 once fabrication is complete. In one embodiment, height H is in the range of about 500 nanometers to about 700 nanometers.

Figure 5:
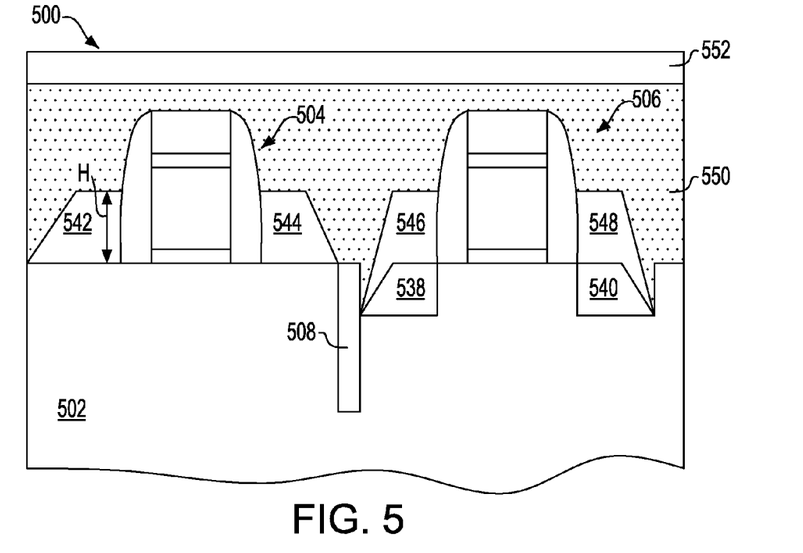
FIG. 5 shows a semiconductor structure after the intermediate processing step of applying protective oxide and nitride layers.

FIG. 5 shows a semiconductor structure 500 after an intermediate processing step. In this processing step, protective layers, which comprise nitride layer 550 and oxide layer 552 are deposited onto semiconductor structure 500. The deposition of layers 550 and 552 may be performed with chemical vapor deposition. In one embodiment, the oxide layer 552 has a thickness in the range of about 900 angstroms to about 1100 angstroms. The combination of layer 550 and layer 552 may be useful during a subsequent CMP (chemical mechanical polish) step. The CMP process first etches away oxide layer 552, until nitride layer 550 is reached. Nitride layer 550 serves as a CMP stopping layer. This approach can help reduce adverse affects such as over-polishing. Once nitride layer 550 is reached, a different CMP process at a slower, more controlled polishing rate is used to reach the level of the top of the silicon regions 542, 544, 546, and 548, which is indicated by height H. The resulting structure is shown in FIG. 6.

Figure 6:
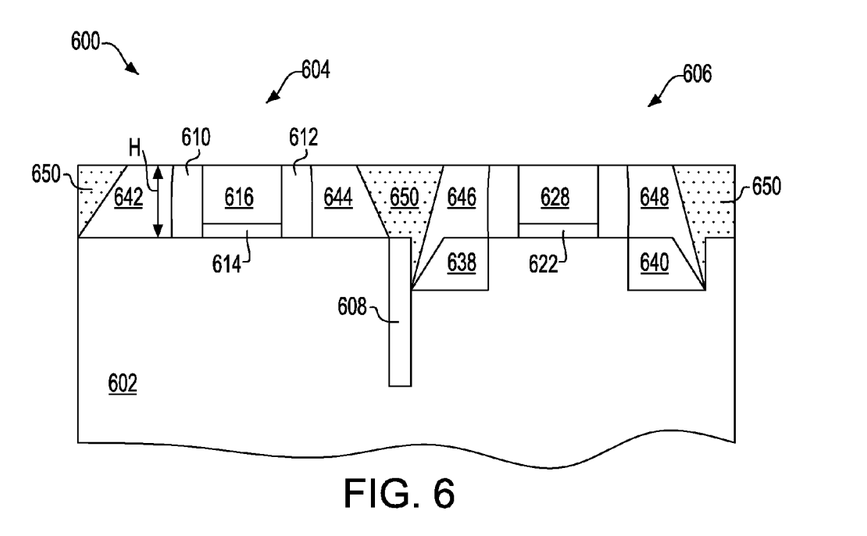
FIG. 6 shows a semiconductor structure after the intermediate processing step of planarizing the semiconductor structure.

FIG. 6 shows a semiconductor structure 600 after an intermediate processing step. In this processing step, the entire structure 600 is planarized to the level of height H. Nitride portions 650 remain, as do portions of the spacers 610, 612, 624, and 626. The gates 616 and 628 are at the same height H as the silicon regions 642, 644, 646, and 648. This structure simplifies subsequent fabrication by eliminating some fabrication steps and also removing some height restrictions for contact structures, as will be explained in more detail in following paragraphs.

Figure 7:
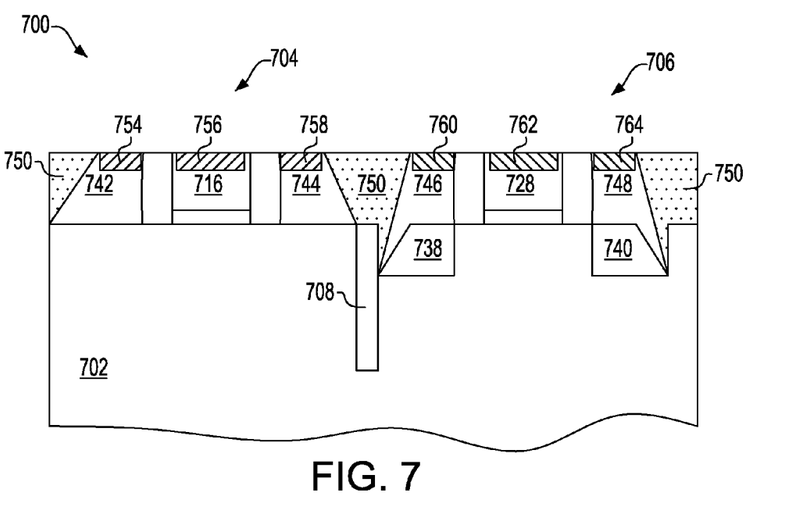
FIG. 7 shows a semiconductor structure after the intermediate processing step of silicide formation.

FIG. 7 shows a semiconductor structure 700 after an intermediate processing step. In this processing step, silicide regions 754, 756, 758, 760, 762, and 764 are formed. The silicide used in regions 754-764 may comprise WSi2, TiSi2, MoSi2, and TaSi2. Other materials may also be used. The silicide may be formed in a variety of ways, such as by deposition of the pure metal onto the silicon region or simultaneous evaporation of the silicon and the metal (co-evaporation). A sputter-deposition process may also be used to form the silicide. The silicide regions 754-764 join with contact structures to provide the electrical connectivity needed to build complex circuits that comprise multiple field effect transistors.

Figure 8:
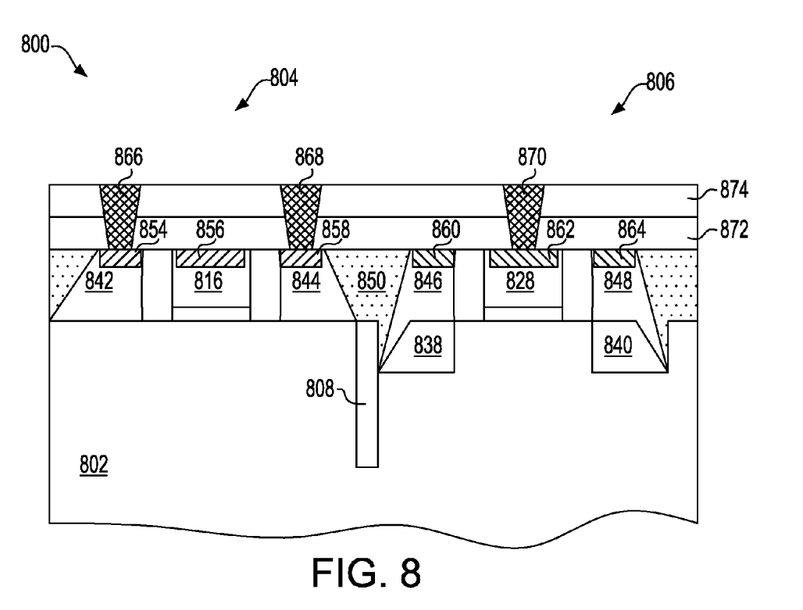
FIG. 8 is a structure in accordance with an embodiment of the present invention.

FIG. 8 is a structure 800 in accordance with an embodiment of the present invention after subsequent processing of semiconductor structure 700 (FIG. 7). Nitride layer 872 and oxide layer 874 are deposited over the structure 800. The deposition of layers 872 and 874 may be performed with chemical vapor deposition. Next, cavities are etched into layers 872 and 874 over the silicide regions 854, 858, and 862, and then are filled with a metal to form contacts 866, 868, and 870. Note that for NFET 804, the contacts are formed on the source and drain silicide regions 854 and 858, whereas for PFET 806, the contact is formed on the gate silicide region 862. Depending on the type of circuit design, some or all of the silicide regions 854-864 may have contacts formed thereon. In one embodiment, the contacts are comprised of tungsten. In another embodiment, the contacts are comprised of copper.

Because the structure 800 is planarized, with the gate silicide regions 856, 862 having a height substantially equal to that of the source and drain silicide regions 854, 858, 860, and 864, the process of forming contacts is simplified. Because all silicide regions are at the same level, the etching of contact vias is simplified, since there is a common depth to etch for both source/drain and gate contacts. Secondly, this structure also reduces the tolerances needed for source and drain contacts (866, 868) in terms of the size of the contacts at the point where they contact the silicide region. Because all silicide regions are at the same level, the risk of having the source/drain contacts accidentally contact the gate region is greatly reduced, as compared with prior art structures that may have the source/drain contacts lower than the gate. These prior art structures require small contact areas that in turn require fairly deep vias. Deep vias in turn have high aspect ratios, and thus, the contacts need to be significantly wider at the top in order to achieve the desired size at the bottom, increasing the amount of space required. This embodiment addresses these shortcomings of prior art structures by creating a planarized structure where the source and drain silicide regions 854, 858, 860, and 864 are at the same height as the gate silicide regions 856 and 862.

Figure 9:
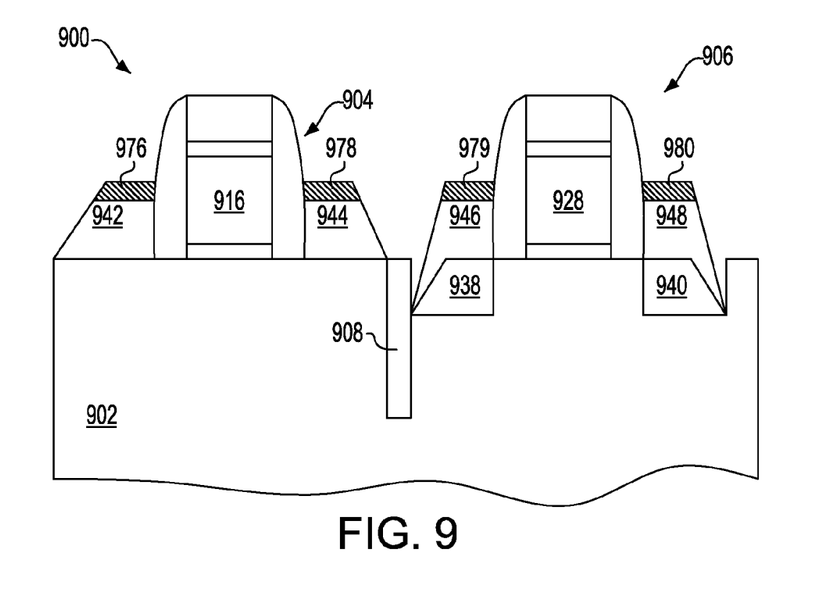
FIG. 9 illustrates an intermediate process step for fabrication of a structure in accordance with an alternate embodiment of the present invention, showing a selection species implant.

FIG. 9 shows a semiconductor structure 900 after an intermediate processing step for an alternate embodiment of the present invention. The starting point for this embodiment is FIG. 4. That is, all processing steps up for this embodiment are similar to that of the first embodiment up to the point shown in FIG. 4. Semiconductor structure 900 has a blanket selection species implant performed. In one embodiment, the selection species is boron. The boron implant forms implant regions 976, 978, 979, and 980 within silicon regions 942, 944, 946, and 948 respectively. After the boron implant, the next process steps are similar to that described for FIG. 5 and FIG. 6 of the first embodiment. In one embodiment, the boron implant uses a dosage of about 5e14 atoms/cm3, applied with an implant energy in the range of about 5 to about 10 keV. This allows the boron to penetrate within the silicon regions 942, 944, 946, 948, but only about halfway in, and not completely into the silicon regions.

Figure 10:
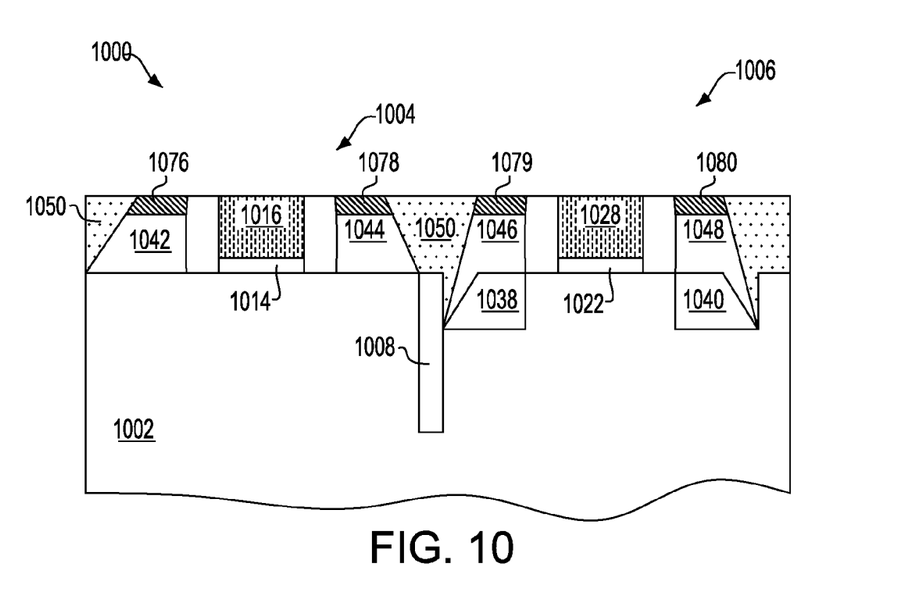
FIG. 10 illustrates an intermediate process step of forming replacement metal gates.

FIG. 10 shows a semiconductor structure 1000 after an intermediate processing step for an alternate embodiment of the present invention. Semiconductor structure 1000 is similar to semiconductor structure 600 of FIG. 6, with the exception of the boron implants 1076, 1078, 1079, and 1080 being present. The boron implants facilitate a selective etch that removes the original gate material (916 and 928 of FIG. 9). The selective etch removes the original gate material, which did not receive a boron implant. The source and drain regions (1042, 1044, 1046, and 1048), which did receive a boron implant, are substantially unaffected by the selective etch.

Subsequently a replacement metal gate (RMG) material is deposited for gates (1016 and 1028) of NFET 1004 and PFET 1006. Note that the material for gate 1016 is typically different from that of gate 1028. This is accomplished by using industry-known lithographic methods to protect one FET (e.g. 1004 or 1006) while depositing the replacement gate material for the other FET. In one embodiment, the RMG material 1016 for NFET 1004 comprises one of hafnium, zirconium, titanium, tantalum, aluminum, and their alloys, e.g., metal carbides that include these elements, i.e., hafnium carbide, zirconium carbide, titanium carbide, tantalum carbide, and aluminum carbide. In one embodiment, the RMG material 1028 for the PFET 1006 comprises one of ruthenium, palladium, platinum, cobalt, nickel, and conductive metal oxides, e.g., ruthenium oxide. In addition, aluminum, titanium, lanthanum, and hafnium can also be used for the PFET RMG material.

In one embodiment, the original gate material (916 and 928 of FIG. 9) is removed with a hydroxide substance, such as potassium hydroxide, ammonium hydroxide or Tetramethylammonium hydroxide. These substances are selective to boron, and since the silicon regions 1042, 1044, 1046 and 1048 have a corresponding boron implant (1076, 1078, 1079, and 1080), they are protected during the etching of the original gate material, and hence, not removed.

Figure 11:
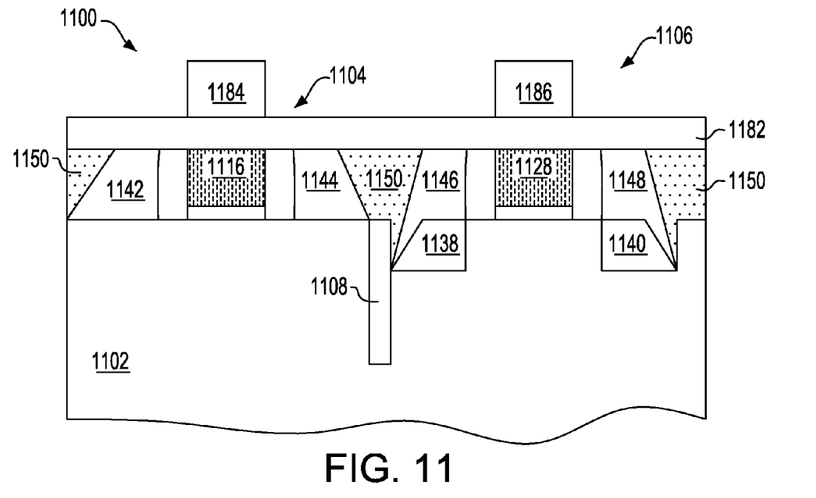
FIG. 11 illustrates an intermediate process step of depositing a cap layer and resist regions.

FIG. 11 shows a semiconductor structure 1100 after an intermediate processing step for an alternate embodiment of the present invention. In this processing step, a cap layer 1182 is deposited, followed by resist regions 1184 and 1186. In one embodiment, cap layer 1182 is a nitride. Resist regions 1184 and 1186 are applied lithographically, and serve to protect the gates of NFET 1104 and PFET 1106 during a subsequent processing step.

Figure 12:
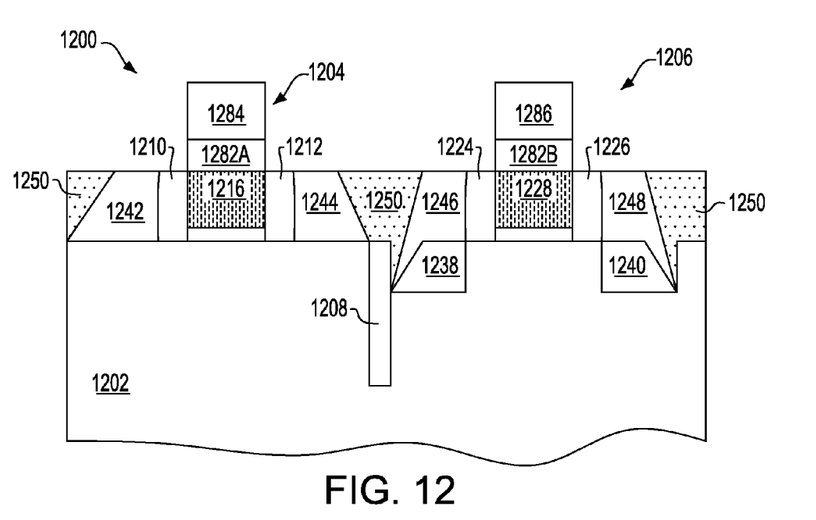
FIG. 12 illustrates an intermediate process step of removing most of the protective nitride layer.

FIG. 12 shows a semiconductor structure 1200 after an intermediate processing step for an alternate embodiment of the present invention. In this processing step, the cap layer is removed from structure 1200, except for portions 1282A and 1282B that are underneath resist regions 1284 and 1286 respectively.

Figure 13:
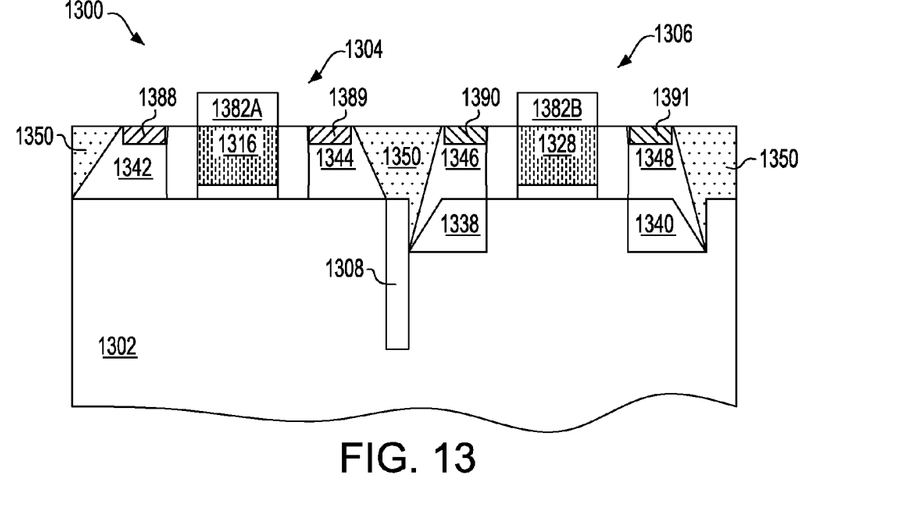
FIG. 13 illustrates an intermediate process step of forming silicide.

FIG. 13 shows a semiconductor structure 1300 after an intermediate processing step for an alternate embodiment of the present invention. In this processing step, the resist regions (1284 and 1286 of FIG. 12) are removed, and silicide regions 1388-1391 are formed in silicon regions 1342, 1344, 1346, and 1348.

Figure 14:
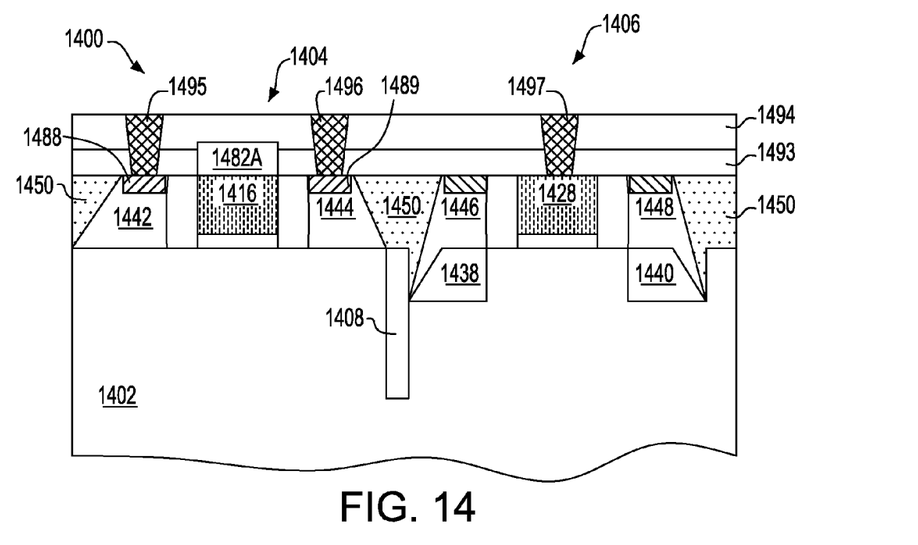
FIG. 14 shows a structure in accordance with an alternate embodiment of the present invention.

FIG. 14 is a structure 1400 in accordance with an alternate embodiment of the present invention after subsequent processing of semiconductor structure 1300 (FIG. 13). Nitride layer 1493 and oxide layer 1494 are deposited over the structure 1400. The deposition of layers 1493 and 1494 may be performed with chemical vapor deposition. Next, cavities 1411, 1413, and 1415 are etched into layers 1493 and 1494 over the silicide regions 1488 and 1489 of the NFET 1404, and a cavity is also etched over the replacement metal gate 1428 of PFET 1406. The cavities are then filled with a metal to form contacts 1495, 1496, and 1497. In one embodiment, the contacts are comprised of tungsten. In another embodiment, the contacts are comprised of copper.

Figure 15:
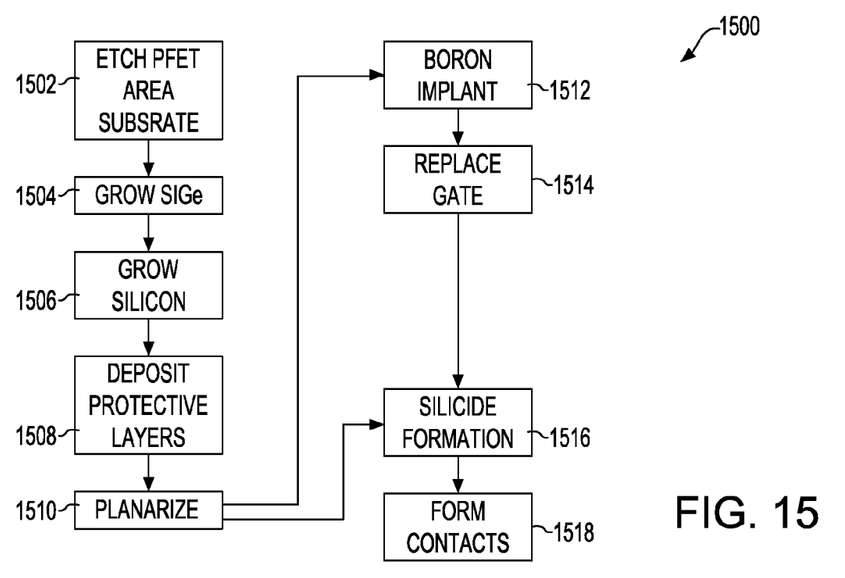
FIG. 15 is a flowchart in accordance with an embodiment of the present invention.

FIG. 15 is a flowchart 1500 indicating process steps for embodiments of the present invention. In process step 1502, the substrate near the PFET is recessed with an etch (see 234 and 236 of FIG. 2). In process step 1504, SiGe is epitaxially grown in the recessed area of the PFET (see 338 and 340 of FIG. 3). In process step 1506, silicon is epitaxially grown for the NFET and the PFET (see 442, 444, 446 and 448 of FIG. 4). In process step 1508, protective nitride and oxide layers are deposited (see 550 and 552 of FIG. 5). In process step 1510 the substrate is planarized, such that the source, drain, and gate of each transistor is at the same height (see structure 600 of FIG. 6).

If the first embodiment, of "gate first" type transistors is to be fabricated, then the process proceeds to process step 1516, where silicide is formed on the source, drain, and gate of each transistor (see 754, 756, 758, 760, 762, and 764 of FIG. 7). In process step 1518, contacts are formed to the desired contacts of the transistor (see 866, 868, and 870 of FIG. 8).

If the second embodiment, of replacement metal gate transistors is to be fabricated, then after process step 1510, the process proceeds to process step 1512, where a boron implant is performed, forming implant regions (see 976, 978, 979, and 980 in FIG. 9). These implant regions serve to protect epitaxially grown silicon during the replacing of the gate material. In process step 1514 the original gate material is replaced with a metal gate (see 1014 and 1022 of FIG. 10). The process then proceeds through process steps 1516 and 1518, in a manner similar to that which is described for the first embodiment.

Figure 16:
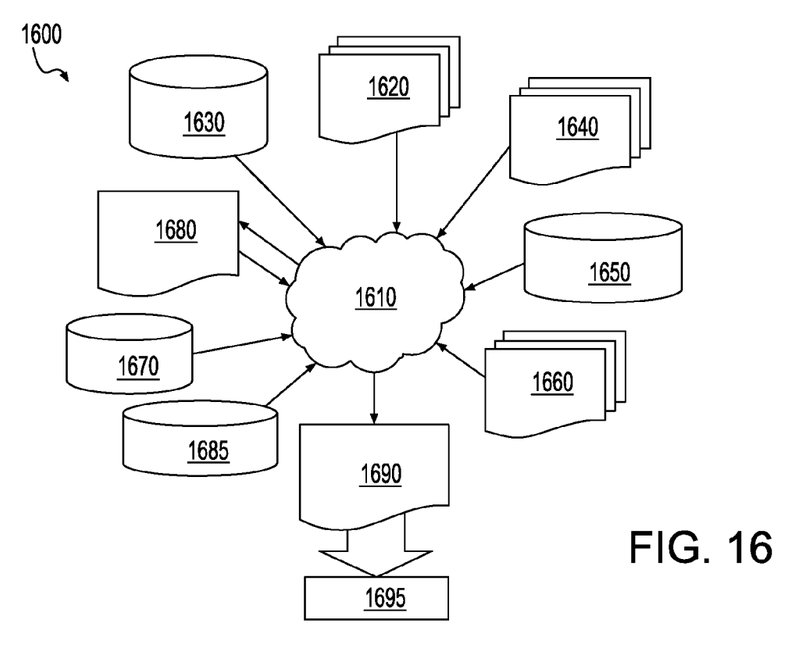
FIG. 16 shows a block diagram of an exemplary design flow for an embodiment of the present invention.

FIG. 16 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 2-14. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 2-14. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 2-14 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 2-14, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 2-14. Design structure 1690 may then proceed to a stage 1695 where, for example, design structure 1690: proceeds to tape-out, is released to manufacturing, is released to a mask house, is sent to another design house, is sent back to the customer, etc.

As can now be appreciated, embodiments of the present invention provide a planarized structure, wherein the gate, source, and drain of a transistor are at the same level, facilitating reduced manufacturing steps and cost.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a semiconductor structure, the method comprising:
   forming an NFET gate and a PFET gate on a surface of a substrate;
   raising a source region and drain region of epitaxial silicon adjacent to the NFET gate;
   raising a source region and drain region of epitaxial silicon adjacent to the PFET gate;
   planarizing the source and drain regions of the PFET and NFET, and the PFET and NFET gates to be of equal height above the surface of the substrate; and
   implanting the source and drain regions of the PFET and NFET with a selection species; and
   wherein the step of implanting the source region and drain regions of the PFET and NFET with a selection species comprises performing a boron implant.

2. The method of claim 1, further comprising:
etching the gates of the PFET and NFET;
depositing a metal on the PFET gate, thereby forming a replacement metal PFET gate; and
depositing a metal on the NFET gate, thereby forming a replacement metal NFET gate.

3. The method of claim 1, further comprising:
forming recesses in the substrate adjacent to the PFET gate; and
growing epitaxial SiGe in the recesses.

4. The method of claim 2, further comprising the steps of:
forming silicide regions on the source region and drain region of the PFET and NFET;
depositing a nitride layer over the substrate;
depositing an oxide layer over the nitride layer;
etching a portion of the nitride and oxide layers to expose at least one of the formed silicide regions;
filling the etched portion of the nitride and oxide layers with a metal to form a contact on at least one formed silicide region;
etching a second portion of the nitride and oxide layers to expose at least one of the replacement metal gates; and
filling the second etched portion of the nitride and oxide layers with a metal to form a contact on at least one of the replacement metal gates.

5. The method of claim 1, wherein the step of performing a boron implant comprises performing a boron implant with a dosage of about 5e14 atoms per cubic centimeter.

6. The method of claim 5, wherein the step performing a boron implant comprises performing a boron implant with an implant energy ranging from about 5 keV to about 10 keV.

7. The method of claim 3, wherein the step of forming recesses in the substrate adjacent to the PFET gate is performed with a reactive ion etch.

8. The method of claim 7, wherein the step of forming recesses in the substrate adjacent to the PFET gate comprises forming etches with a depth ranging from about 20 nanometers to about 60 nanometers.

* * * * *